United States Patent [19]

Jonker et al.

[11] Patent Number: 4,828,935
[45] Date of Patent: May 9, 1989

[54] PASSIVATING LAYER FOR III-V SEMICONDUCTOR MATERIALS

[75] Inventors: Berend T. Jonker, Bowie, Md.; Gary A. Prinz; James J. Krebs, both of Alexandria, Va.

[73] Assignee: The United States of America as represented by the Secretary of the Navy, Washington, D.C.

[21] Appl. No.: 176,115

[22] Filed: Mar. 30, 1988

[51] Int. Cl.$^4$ .................... H01L 21/265; H01S 3/19
[52] U.S. Cl. ..................... 428/642; 357/52; 437/22; 437/236; 428/620
[58] Field of Search .............. 437/236, 22; 357/52; 428/642, 620

[56] References Cited

U.S. PATENT DOCUMENTS

| | | | |
|---|---|---|---|
| 4,095,011 | 6/1978 | Hawrylo et al. | 357/52 |
| 4,302,278 | 10/1981 | Pancholy et al. | 156/613 |
| 4,354,198 | 10/1982 | Hodgson et al. | 357/52 |
| 4,546,372 | 10/1985 | Shuskus | 357/52 |
| 4,726,885 | 2/1988 | Teherani et al. | 204/34.5 |
| 4,751,708 | 6/1988 | Jackson et al. | 357/52 |

OTHER PUBLICATIONS

Furdyha, J. K., Jour. Vac. Sci. Technol. 4A (Jul.-Aug. 1986) 2002.
Jonker et al., Appl. Phys. Letts. 50 (1987) 848.
Kolodziejski et al., Appl. Phys. Letts. 44 (1984) 799.
Herman et al., Jour. Crystal Growth, 66 (1984) 480.

*Primary Examiner*—Upendra Roy
*Attorney, Agent, or Firm*—Thomas E. McDonnell; A. David Spevack

[57] ABSTRACT

A passivating or insulating layer is described for semiconductor substrates. The passivating layer is of the formula $Zn_{1-x-y}M_xQ_y Se:D$ where $0 \leq x \leq 1$, $0 \leq y \leq 1$, M and Q represent different specified elements and D represents a dopant. It is prefered that M and Q are Fe or Mn. The substrate is preferably a III-V semiconductor compound. The devices are capable of rapid switching among other uses.

20 Claims, No Drawings

PASSIVATING LAYER FOR III-V SEMICONDUCTOR MATERIALS

BACKGROUND OF THE INVENTION

1. Field of the Invention

This invention relates to a semiconductor structure in which an epitaxial semiconductor layer is used to electrically passivate and insulate the semiconductor on which it is deposited. Particularly, this invention relates to a semiconductor structure wherein the passivating-/insulating layer is a composition of the general formula $Zn_{1-x-y}M_xQ_ySe:D$ $0 \leq x23$ $1$; $0 \leq y \leq 1$, M and Q are different selected elements and D is a dopant for ZnSe.

2. Description of the Prior Art

In today's world, developments in electronic devices demand faster and faster reaction speed. As noted by D. L. Lile in a review article entitled "*Dielectric Layers for Device Applications on III-V Compounds-An Assessment,*" Insulating Films on Semiconductors, Simonne & Buxo (editors), Elsevier Science Publishers, Holland, pp. 57-63 (1986), work on improving electronic devices has been driven by the "requirements of increased data processing rates and has taken a variety of forms including ...the use of "high velocity" materials and novel device structures such as the HEMT in AlGaAs/GaAs to increase the rate of information transfer. Such structures have typically been proposed on the III-V semiconductor compounds because it is this class of materials which has in the general both the required high velocity carriers, the correct band gap for operation at room temperature and a structure that allows for a variety of intermixed and crystallographically compatible materials combinations."

Lile states that "to fully utilize these compound semiconductors however it is of some importance that appropriate dielectrics be available to provide for passivation, crossover isolation and active gate insulation. To date, efforts to develop such insulators for III-V semiconductors have met with only limited success".

Lile further notes on page 58 that "Passivation, even on the most widely studied III-V compound GaAs... is less than a fully developed process which needs solution, even if non-insulated gate active device structures are retained. Clearly, bipolar circuits as we now know them on Si would be impossible in the absence of good $SiO_2$ layers and likewise a GaAs MESFET technology also will require good passivation to fully meet its performance expectations."

Thus, as Lile notes above, the art has yet to develop a suitable passivating or insulating layer for III-V compounds which functions as effectively as silicon dioxide does in silicon-based semiconductors.

Several techniques have been developed to "work around" the absence of an effective passivation layer. The techniques used are described by Lile in his assessment, and in an earlier review article by H. H. Wieder, "Device Physics and Technology of III-V Compounds". J. Vac. Sci. Technol. A2(2), pages 97-102, Apr-June (1984)

Wieder discusses the problems in creating effective transistors with III-V compound semiconductors, particularly gallium-based semiconductors such as gallium arsenide (GaAs). To date, the materials proposed and tried as insulating layers for III-V compound semiconductor devices have not been satisfactory. These insulators do not result in the development of the full potential of III-V compound semiconductors devices.

The insulating materials applied to date have been applied by several techniques including vapor phase deposition, epitaxial crystal growth, pyrolisis etc. The techniques are all well documented in the art.

Several substances and techniques for the passivation have been described and claimed in the patent literature. Shuskus, in U.S. Pat. No. 4,545,572, describes a phosphorous-nitrogen based glass for use as a passivation layer on III-V semiconductor materials. Hodgson et al. describe a zinc-suplhide capping layer for gallium-arsenide devices in U.S. Pat. No. 4,354,198. Pancholy et al. describe a thermally deposited arsenic-oxide layer as a surface passivation method in U.S. Pat. No. 4,302,278 and Teherani et al. describe passivating $Hg_{1-x}Cd_xTe$ substrates with CdSe or HgSe.

In recent years, research has been conducted to make and study a series of compounds known generally as diluted magnetic semiconductors (DMS) or semimagnetic semiconductors. These DMS compounds are ternary or quaternary semiconducting compounds whose lattice is partly made up of substitutional magnetic ions. The majority of DMS's incorporate a magnetic ion, usually mangansee, into II-VI semiconducting hosts, particularly chalcogenides.

The properties of these DMS alloys and crystals of these alloys have been discussed in several review articles including, "Diluted Magnetic Semiconductors: An Interface of Semiconductor Physics and Magnetism", Furdyna, J. Appl. Phys. 53(11), pp. 7637-7643, Nov. (1982); "Effect of Fe on the Carrier Instability in HgSe", Vaziri et al, Appl. Phys. Lett. 47(4), pp. 407-409, Aug 15, 1985; "Diluted Magnetic Semiconductors: Issues and Opportunities", Furdyna, J. Vac. Sci. Technol A(4) (1986), pp. 2002-2009; "Bonding and Stability in Narrow-Gap Ternary Semiconductors for Infrared Applications", Wall et al., J. Vac. Sci. Technol A(4), pp. 2020-2013, Jul/Aug (1986); "Reduction of Charge-Center Scattering Rate in $Hg_{1-x}Fe_xSe$", Pool et al., Physical Review B, Vol. 35, pp. 3900-3909, Mar. 15, 1987-I; "Band Structure and Electronic Properties of Mercury Chalcogenide Alloys Containing Iron", Reifenberger et al., J. Vac. Sci. Techol. A5(5), pp. 2995-3002, Sept/Oct (1987).

Each of these articles discusses the properties of DMS alloys and speculates that the alloys should ultimately find application in devices. For example, Reifenberger et al., J. Vac. Sci. Technol., Vol. 5(5) at p. 3001 last paragraph states with respect to mercury compounds: "Because of the expected increase in the stability of the electron concentration in the materials, they may ultimately be attractive from the device application point of view." In each of the articles discussing iron-containing DMS's, the researchers found markedly improved results and greater stability then in the Mn-based counterparts.

The inventors and a co-worker reported a study of the properties of an epitaxial layer of $Zn_{1-x}Fe_xSe$ on GaAs in an article entitled "Molecular Beam Epitaxial Growth and Characterization of the Diluted Magnetic Semiconductor $Zn_{1-x}Fe_xSe$", Jonker et al., Appl. Phys. Lett 50(13), pp. 848-850, Mar. 30, 1987. An abstract of a related paper was published earlier in March. The abstract is entitled "MBE Growth and Characterization of $Zn_{1-x}Fe_xSe$", Jonker, et al., Bull. Amer. Physical Soc. Vol. 32(3), p. 810, March (1987). The articles do not report application of these structures as devices.

SUMMARY OF THE INVENTION

Therefore, it is an object of this invention to provide a passivating layer for III-V semiconductor materials.

Further, it is an object of this invention to provide a passivating layer for III-V semiconductor materials which will provide the breadth of applications for these materials as is now possible for silicon based devices when passivated with $SiO_2$.

In addition, it is an object of this invention to provide a passivating layer consisting of a diluted magnetic semiconductor material which forms a good lattice match to III-V substrate materials.

Also, it is an object of this invention to provide a passivating layer for semiconductor substrates which does not pin the Fermi level of the substrate to an extent which prevents practical device operation.

Yet another object of this invention is to provide a layer for semiconductor materials which has very high resistivity and exellent electrically insulating properties.

Yet an additional object of this invention is to provide a passivating layer for GaAs in the form of an epitaxial layer of diluted magnetic semiconductor material.

These and other objects of this invention can be achieved by producing a suitably doped layer of a semiconductor material of this invention on a semiconductor substrate.

PREFERRED EMBODIMENTS

We have found that the Zinc Selenide binary semiconductors and alloys of this invention having the general formula $Zn_{1-x-y}M_xQ_y$Se:D provide a suitable passivating layer for III-V semiconductor materials which sufficiently minimizes surface state density, surface charge accumulation or charge carrier recombination to significantly improve practical electronic device operation. In this invention $0 \leq x \leq 1$, $0 \leq y \leq 1$, M and Q are selected from the group of elements consisting Cadmium (Cd), Chromium (Cr), Manganese (Mn), Cobolt (Co), Iron (Fe), and Nickel (Ni) and M and Q are not the same. D is a dopant compatible with ZnSe.

The passiviating layer of this invention is in the form of a film adhered to at least one surface of the substrate. The film can be crystaline, polycrystaline, or amorphous. Preferably, the film is a single epitaxial crystal. The insulating nature of the film is demonstrated by conventional Hall measurements in the van der Pauw configuration. These measurements show that the necessary resistivity is comparable to that exhibited by a $SiO_2$ passivating layer on Si substrates.

Epilayers of this invention have very high resitivities providing excellent electrically insulating properties and the epilayers form good lattice matches to the semiconductor substrates. The epilayers particularly provide the requisite passivating layer for GaAs device technology. With a passivation layer of this invention, the device architecture for GaAs and other substrates can parallel Silicon device architecture.

Zinc Selenide itself is a passivating layer of this invention. We have found that the prefered passivating layers are those formed from diluted magnetic semiconductor materials. Diluted magnetic semiconductors (DMS's) form a relatively new class of materials which exhibit both semiconducting and magnetic properties. The compounds, or more properly alloys are II-VI semiconductors with some fraction of the Group II element substituted at random by a transition metal magnetic ion.

The semiconducting properties are similar those of the host II-VI compound. DMS compounds exhibit a compositionally dependent band gap, lattice constant, and effective mass typical of ternary alloy systems, as well as a rich spectrum of magneto-optic and magneto-transport properties. It is theorized that these latter properties are a manifestation of the spin-spin exchange interaction between the localized magnetic moments of the substitutional magnetic ions and the band electrons.

The DMS materials are formed where x and/or $y > 0$. It is prefered that M and Q be selected from the group of elements consisting of Mn and Fe and M and Q are not the same. The more prefered DMS materials are $x > 0$, $y = 0$ and M is Mn or Fe. Most prefered are compositions ZnSe, $Zn_{1-x}Mn_x$Se, $Zn_{1-x}Fe_x$Se and $Zn_{1-x-y}Fe_xMn_y$Se. The values of x and y are varied to create specific crystal architecture and lattice match.

The semiconductor substrate can be any of the known semiconductor substrates which have a reasonably good lattice match to the passivating layer. Preferably, the substrates are III-V, II-VI or IV-VI semiconductor compounds. More preferably the substrates are III-V semiconductor materials such as GaAs, InP, InSb and AlAs and ternary derivatives. The ternary derivatives are such compositions as, (Ga,Al)As, (Ga,In)As, (Ga,In)P (Ga,In)Sb and (Ga,Al)P and the like. The substrate may be in any form including an epilayer deposited on another epilayer, a buffer layer, a superlattice or bulk substrate. As needed, sandwich structures of passivating layers of this invention and substrates can also be created.

The passivating or insulating layer is deposited by any one of several known techniques such as molecular beam epitaxy, atomic layer epitaxy, chemical vapor deposition, sputtering, electrolysis, or other thin film deposition techniques. Herman et al. in "Atomic Layer Epitaxy of $Cd_{1-x}Mn_x$Te Grown on CdTe(III)B Substrates," J. Crystal Grown 66 (1984), pp. 480-483, describes the use of atomic layer epitaxy for growing a DMS film on a substrate. Kolodziejski et al., in "Molecular Beam Epitaxy of $Cd_{1-x}Mn_xTe_1$" Appl. Phys. Lett. 44(8), pp. 799-801, Apr. 15, 1984, describes the use of molecular beam epitaxy to grow a DMS crystal on GaAs.

The passivating layer should be of sufficient thickness to prevent electrical breakdown. The epilayers of DMS can be grown from a few hundred angstroms thick to several microns thick. Preferably, the DMS layer is less than 2 microns thick.

The passivating layer may be doped with dopants to establish specific Fermi level position, interface band bending, energy levels, band gap, carrier concentration/mobility, resistivity, lattice constant and other electronic or structural parameters. The dopants are those used to dope metal chalcogen semiconductor films.

Now having generally described the invention, the following examples are provided to show specific applications of the invention.

EXAMPLE 1

Single-crystal epilayers of zinc blende $Zn_{1-x}Fe_x$Se for $0 \leq x \leq 0.22$ are grown on GaAs(100) substrates. The dependence of the lattice parameter and optical band-gap energy on Fe concentration is obtained. Reflection high-energy electron diffraction (RHEED), Auger electron spectroscopy (AES), and x-ray rocking curve and $\theta-2\theta$ measurements as well as superconducting quantum interference device (SQUID) magnetometry data are determined.

The films are grown in a PHI model 400 MBE system equipped with AES and RHEED. The GaAs substrates are commercially obtained heavily doped (Si) n-type (100) wafers oriented 2° off axis toward (110) and polished on one side. This 2° off-axis orientation is used as an industry standard for MBE compound semiconductor growth since it is known to promote proper nucleation. Each substrate is chemomechanically polished and etched with a 0.2% bromine-methanol solution, passivated with a de-ionized water rinse, and immediately loaded into the MBE system. Final cleaning is accomplished by heating to 585° C. for 30 minutes in ultrahigh vacuum to desorb the passivating oxide layer.

The (Zn,Fe)Se epilayers are grown directly on the clean GaAs substrate to a typical thickness of 1 micron using three effusion cells containing ZnSe, Se, and Fe. These sources are typically operated at nominal temperatures of 510° C., 90° C., and 790°-980° C., respectively. The incident fluxes are measured with a quadrupole mass spectrometer, and energy dispersive x-ray fluorescence is used to determine the composition of the films following growth. The growth rates range from 30 to 75 A/min depending on the incident Fe flux at a substrate temperature of 325° C.

To evaluate the samples, x-ray rocking curves are measured using a double-crystal diffractometer and CuKa radiation. These measurements are carried out in a parallel geometry with the first crystal being GaAs. The rocking curve FWHM for the (400) reflection increases from 232 arc s for x =0, to 284 arc s for x =0.027 and up to 462 arc s for x =0.22. The general trend of the data suggests that a slight increase in Fe content causes the half-width to broaden significantly.

The misfit between $Zn_{1-x}Fe_xSe$ and GaAs ranges from 0.25 to 0.61% for values of x between 0 and 0.22. The increase of the rocking curve FWHM with Fe content appears to reflect the increase in misfit between epilayer and substrate, and the magnitude of the increase is comparable to that found for (Zn,Cd)Te on InSb. For comparision, the narrowest rocking curve reported by Kleiman et al. J. Appl. Phys. 61, 2067 (1987), for MBE-grown ZnSe on GaAs(100) has a FWHM of 130 arc s for a 2.5 micron film, while more typical values obtained ranged from 200 to 400 arc s.

The approximate room-temperature optical band gap for each epilayer is obtained by optical absorption in a reflection geometry by measuring the wavelength at which the interference fringes produced by reflection at the (Zn,Fe)Se surface and the (Zn,Fe)Se/GaAs interface are abruptly extinguished. This technique actually measures the point at which the absorption coefficient of the ZnFeSe reaches a value of $\sim 10^4$ for a 1 micron film, and will generally give a value slightly larger than the true electronic band gap. This method yields a value of 2.68 eV for pure ZnSe, compared to a value of 2.67 eV quoted in the literature. See W. H. Strehblow and E. L. Cook, J. Phys. Chem. Ref. Data 2, (63)(1973); W. F. Leonard and T. L. Martin, Electronic Structure and Transport Properties of Crystals (Krieger, Huntington, NY. (1980), p. 349. The band gap increases approximately linearly with Fe concentration for $0 \leq x \leq 0.22$ with a net change of only $\sim 50$ meV. This change is consistent with the relatively small variation in lattice parameter, and is about a factor of 2 smaller than that observed for $Zn_{1-x}Mn_xSe$. See L. A. Kolodziejski, R. L. Gunshor, R. Venkatasubramanian, T. C. Bonsett, R. Frohne, S. Datta, N. Otsuka, R. B. Bylsma, W. M. Becker and A. V. Nurmikko, J. Vac. Sci. Technol. B 4, 583 (1986).

$Zn_{1-x}Fe_xSe$ epilayers with significantly higher Fe content, with $0.22 \leq x \leq 1$ exhibit very well-ordered epitaxial growth as demonstrated by RHEED up to a few thousand angstroms thickness; however, there is indication that the crystalline quality of the epilayer fails beyond that point, perhaps due to a disruption of the zinc blende structure. Thin layers of these higher Fe concentractions can be readily incorporated in a $ZnSe/Zn_{1-x}Fe_xSe$ superlattice structure.

EXAMPLE 2

A (Zn,Mn)Se crystal is grown in a PHI Model 400 MBE system equipped with AES and RHEED. GaAs(001) device grade wafers are used as substrates, and prepared in the same manner as described in Example 1 by using a 0.2%Br-methanol polish and etch, with final cleaning accomplished by heating to 585° C. in ultra-high vacuum just prior to growth. The (Zn,Mn)Se epilayer is deposited using elemental Knudsen cell sources at a substrate temperature of 330° C. and growth rates of $\sim 0.33$ micron/hr. The flux is monitored with a quadrupole mass spectrometer, and bulk stoichiometry verified with energy dispersive x-ray fluorescence following growth.

In a similar manner epitaxial films of a range of composition of the general formula as $Zn_{1-x}Mn_xSe$, $Zn_{1-x-y}Fe_xMn_ySe$ can be prepared. The values of x and y are varied to match the passivating layer structure to the substrate structure.

These DMS insulating layers can be used in electronic devices. In a standard MOSFET (metal-oxide semiconductor field effect transistor), an insulating oxide barrier is needed between the metal layer and the semiconductor base. This new application would permit improved reliability in device construction by replacing the oxide with the material of this invention to form a MISFET (metal-insulator-semiconductor FET) with improved characteristics for the I layer, resulting in improved device operation. A second application will permit fabrication of inversion layer devices which require very low III-V surface state densities and carrier traps for successful operation.

Obviously many modifications and variations of the present invention are possible in light of the above teachings. It is therefore to be understood that within the scope of the appended claims, the invention may be practiced otherwise than as specfically described.

What is claimed and desired to be secured by Letters Patent of the United States is:

1. A passivating layer for III-V semiconductor materials comprising a layer of a composition of the formula $Zn_{1-x-y}M_xQ_ySe:D$ wherein $0 \leq x \leq 1$, $0 \leq y \leq 1$, M and Q are an element selected from the group consisting of Cd, Cr, Mn, Co, Fe, Ni, and M and Q are different and D is a dopant compatible with ZnSe on the III-V semiconductor material.

2. A passivating layer according to claim 1 wherein the composition is in the form of an single crystal epitaxial layer.

3. A passivating layer according to claim 1 wherein $y=0$.

4. A passivating layer according to claim 1 wherein M and Q are selected from the group consisting of Mn and Fe.

5. A passivating layer according to claim 1 having a thickness less than 2 microns.

6. A passivating layer according to claim 2 wherein the III-V semiconductor material is selected from the group consisting of GaAs, InP, InSb, AlAs and ternary derivatives thereof.

7. A passivating layer according to claim 2 wherein $y=0$.

8. A passivating layer according to claim 2 wherein M and Q are selected from the group consisting of Mn and Fe.

9. A passivating layer according to claim 2 having a thickness less than 2 microns.

10. A passivating layer according to claim 3 wherein $0 < x \leq 1$.

11. A passivating layer according to claim 3 wherein M is selected from the group consisting of Mn and Fe.

12. A passivating layer according to claim 4 wherein M is Fe.

13. A passivating layer according to claim 6 wherein the ternary derivatives are (Ga,In)As; (Ga,Al)As; (Ga,In)P; (Ga,In)Sb; (Ga,Al)P.

14. A passivating layer according to claim 8 wherein $0 < x \leq 1$.

15. A passivating layer according to claim 7 wherein M is selected from the group consisting of Mn and Fe.

16. A passivating layer according to claim 10 wherein M is selected from the group consisting of Mn and Fe.

17. A passivating layer according to claim 15 wherein the III-V compound is selected from the group consisting of GaAs, GaP, InP, InSb and AlAs, and ternary derivatives thereof.

18. A passivating layer according to claim 16 wherein M is Fe.

19. A passivating layer according to claim 16 wherein the III-V compound is selected from the group consisting of GaAs, GaP, InP, and InSb and AlAs, and ternary derivatives thereof.

20. A passivating layer according to claim 18 having a thickness less than 2 microns.

* * * * *